United States Patent
Chen et al.

(10) Patent No.: US 12,027,408 B2
(45) Date of Patent: Jul. 2, 2024

(54) TRANSFER DEVICE OF MICRO-ELEMENTS AND MANUFACTURING METHOD THEREOF

(71) Applicant: Chengdu Vistar Optoelectronics Co., Ltd., Sichuan (CN)

(72) Inventors: Bo Chen, Chengdu (CN); Rubo Xing, Chengdu (CN); Enqing Guo, Chengdu (CN); Dong Wei, Chengdu (CN); Xiaowei Li, Chengdu (CN); Bo Chen, Chengdu (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 799 days.

(21) Appl. No.: 17/144,474

(22) Filed: Jan. 8, 2021

(65) Prior Publication Data
US 2021/0134649 A1   May 6, 2021

Related U.S. Application Data (63) Continuation of application No. PCT/CN2019/092381, filed on Jun. 21, 2019.

(30) Foreign Application Priority Data

Nov. 29, 2018  (CN) .......................... 201811446283.7

(51) Int. Cl.
*H01L 21/683*  (2006.01)
*H01L 21/67*   (2006.01)
(Continued)

(52) U.S. Cl.
CPC .... *H01L 21/6838* (2013.01); *H01L 21/67144* (2013.01); *H01L 25/0753* (2013.01); *H01L 33/0095* (2013.01)

(58) Field of Classification Search
CPC ........................... H01L 21/6838; H01L 23/32
See application file for complete search history.

(56) References Cited

U.S. PATENT DOCUMENTS

| | | | |
|---|---|---|---|
| 5,278,368 A | 1/1994 | Kasano et al. | |
| 10,410,893 B2 * | 9/2019 | Hsu | H01L 24/00 |

(Continued)

FOREIGN PATENT DOCUMENTS

| | | | |
|---|---|---|---|
| CN | 106229287 A | 12/2016 | |
| CN | 106449498 A | 2/2017 | |

(Continued)

OTHER PUBLICATIONS

Office Action issued on May 10, 20212, in connection with corresponding Chinese Application No. 201811446283.7 (19 pp., including machine-generated English translation).

(Continued)

*Primary Examiner* — David A Zarneke
(74) *Attorney, Agent, or Firm* — Maier & Maier, PLLC

(57) ABSTRACT

A transfer device of micro-elements and manufacturing method thereof are provided in the present disclosure. The transfer device of micro-elements may comprise a vacuum chamber, a plurality of movable mass blocks and a plurality of electrode assemblies. The vacuum chamber may define a vacuum space and a plurality of through holes. The plurality of through holes can communicate the vacuum space with outside. The plurality of through holes can be configured to suck the micro-elements. The plurality of movable mass blocks may be arranged in the vacuum chamber. Each movable mass block may be arranged corresponding to a through hole. The plurality of electrode assemblies may be fixed in the vacuum chamber. Each electrode assembly can be arranged corresponding to a through hole.

14 Claims, 4 Drawing Sheets

(51) Int. Cl.
    *H01L 25/075*     (2006.01)
    *H01L 33/00*     (2010.01)

(56) References Cited

U.S. PATENT DOCUMENTS

| | | | |
|---|---|---|---|
| 10,622,234 B2 * | 4/2020 | Hsu | H01L 21/67288 |
| 10,643,879 B2 * | 5/2020 | Hsu | H01L 21/6835 |
| 2015/0028362 A1 | 1/2015 | Chan et al. | |

FOREIGN PATENT DOCUMENTS

| | | |
|---|---|---|
| CN | 107026124 A | 8/2017 |
| CN | 107039298 A | 8/2017 |
| CN | 207116403 U | 3/2018 |
| JP | 2000264428 A | 9/2000 |
| JP | 2001223236 A | 8/2001 |

OTHER PUBLICATIONS

International Search Report issued on Sep. 18, 2019 in corresponding International Application No. PCT/CN2019/092381; 7 pages.

\* cited by examiner

TRANSFER DEVICE OF MICRO-ELEMENTS AND MANUFACTURING METHOD THEREOF

CROSS-REFERENCE TO RELATED APPLICATIONS

The present application is a continuation application of International (PCT) Patent Application No. PCT/CN2019/092381 filed Jun. 21, 2019, which claims foreign priority of Chinese Patent Application No. 201811446283.7, filed on Nov. 29, 2018, the entire contents of which are hereby incorporated by reference in their entireties.

FIELD

The described embodiments relate to a field of transferring micro-elements technology, and in particular to a transfer device of micro-elements and manufacturing method thereof.

BACKGROUND

For devices used in people's daily life, miniaturization of components has become one of development trends. For example, micro-sized light emitting diodes (micro-LEDs) are utilized in display devices, that is, multiple micro-LEDs are integrated on a display panel. Since micro-LEDs have an extremely high luminous efficiency and a long service life, more and more companies began to develop display panels of micro-LEDs. Micro-LEDs are expected to become a next generation of display technology.

However, due to limitations of the manufacturing process, the micro-elements are difficult to transfer.

SUMMARY

A transfer device of micro-elements and manufacturing method thereof are provided in the present disclosure to solve the problem of difficult transferring of micro-elements.

To solve the above technical problem, on one aspect, a transfer device of micro-elements is provided in the present disclosure. The transfer device of micro-elements may comprise a vacuum chamber, a plurality of movable mass blocks and a plurality of electrode assemblies. The vacuum chamber may define a vacuum space and a plurality of through holes. The plurality of through holes can communicate the vacuum space with outside. The plurality of through holes can be configured to suck the micro-elements. The plurality of movable mass blocks may be arranged in the vacuum chamber. Each movable mass block may be arranged corresponding to a through hole. The plurality of electrode assemblies may be fixed in the vacuum chamber. Each electrode assembly can be arranged corresponding to a through hole. When an electrode assembly is not energized, a corresponding movable mass block may be suspended over a corresponding through hole, the corresponding through hole can be opened. When the electrode assembly is energized, the electrode assembly may attract or repel the corresponding movable mass block to move, and the corresponding through hole can be blocked by the movable mass block.

To solve the above technical problem, on another aspect, a manufacturing method of a transfer device of micro-elements is provided in the present disclosure. The manufacturing method of a transfer device of micro-elements may comprise: providing a first silicon wafer comprising a first substrate layer and a first top silicon layer, and etching the first top silicon layer to define a first shallow cavity with at least one fixed seat retained in the first shallow cavity; patterning the first top silicon layer after being etched to obtain a plurality of second electrodes; providing a second silicon wafer and bonding the second silicon wafer to the at least one fixed seat, wherein the second silicon wafer is without being contacted with the plurality of second electrodes; patterning the second silicon wafer to form at least one cantilever beam connected to the at least one fixed seat and a plurality of movable mass blocks connected to the at least one cantilever beam; providing a third silicon wafer and etching the third silicon wafer to define a second shallow cavity; sputtering a metal material to the second shallow cavity to form a plurality of first electrodes; bonding the third silicon wafer to the first silicon wafer and the second silicon wafer, wherein the second shallow cavity is disposed towards the first shallow cavity; etching the third silicon wafer to define a plurality of through holes, wherein the plurality of movable mass blocks are suspended over the plurality of through holes.

The transfer device of micro-elements and manufacturing method thereof provided in the present disclosure have the following beneficial effects.

(1) In the transfer device of micro-elements of this disclosure, the plurality of movable mass blocks are suspended above over the plurality of through holes. The movement of each movable mass block can be controlled by a corresponding electrode assembly to block or open a corresponding through hole. The opened through hole can be used to suck a corresponding micro-element, and then to transfer the corresponding micro-element.

(2) Part of the plurality of electrode assemblies can be selectively controlled to be energized, such that part of the plurality of movable mass blocks can be moved to block corresponding through holes. Other unblocked through holes can be used to suck and transfer corresponding micro-elements. In this way, selective suction and transfer of micro-elements can be achieved.

DETAILED DESCRIPTION

The technical solutions in the embodiments of the present disclosure will be clearly and completely described in connection with the drawings of the embodiments of the present disclosure. Obviously, the described embodiments are merely parts of the embodiments of the present disclosure, not all embodiments. Based on the embodiments in the present disclosure, all other embodiments can be obtained by those skilled in the art without any creative work are within the scope of the protection of the present disclosure.

A transfer device in the present disclosure is used to transfer micro-elements. Taking a micro-LED display panel as an example, the transfer device in the present disclosure can be used to transfer micro-LEDs, thereby further achieving a selective mass transfer of micro-LEDs. Other micro-elements with a same dimensional characteristic as the micro-LEDs can also be transferred by the transfer device of the present disclosure. Micro-LEDs, i.e. the micro-elements described in the present disclosure, can be used to realize self-luminescence of pixels in the display panel. A micro-element can act as a pixel. In a current display panel, there are generally thousands of pixels. Accordingly, there are thousands of micro-elements in the display panel. In the transfer device of the present disclosure, a plurality of movable mass blocks can be arranged suspending over a plurality of through holes. The movement of each movable mass block can be controlled by a corresponding electrode assembly so as to block or open a corresponding through hole to suck and transfer a corresponding micro-element. Further, in the transfer device of the present disclosure, a plurality of electrode assemblies can be controlled so that part of the plurality of electrode assemblies can be selectively energized, thereby part of the plurality of movable mass blocks may move to block a corresponding part of the plurality of through holes. Other unblocked through holes can be used to suck and transfer corresponding micro-elements. Accordingly, multiple micro-elements can be selectively sucked and transferred.

Figure 1:
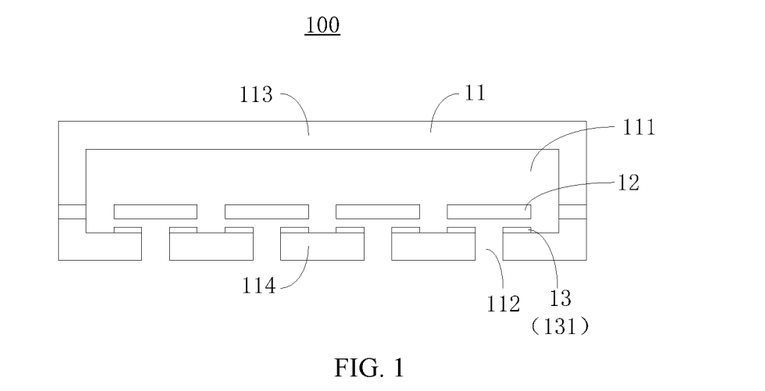
FIG. 1 is a structural view of a transfer device of micro-elements according to an embodiment of the present disclosure.

FIG. 1 is a structural view of a transfer device of micro-elements according to an embodiment of the present disclosure. The transfer device 100 in this embodiment may include a vacuum chamber 11, a plurality of movable mass blocks 12 and a plurality of electrode assemblies 13.

The vacuum chamber 11 may define a vacuum space 111. Specifically, the vacuum chamber 11 can be connected to a vacuum pump. Under the action of the vacuum pump, the vacuum space 111 can maintain a vacuum environment inside the vacuum chamber 11. The vacuum chamber 11 may further define a plurality of through holes 112 communicating the vacuum space 111 with outside. When the vacuum space 111 is defined after the vacuum chamber 11 being evacuated by the vacuum pump, micro-elements can be sucked by the plurality of through holes 112.

The plurality of movable mass blocks 12 may be arranged in the vacuum space 111. Specifically, the plurality of movable mass blocks 12 may be connected to the vacuum chamber 11 and disposed in the vacuum space 111. Each movable mass block 12 may be arranged corresponding to a through hole 112. That is, each movable mass block 12 can be used to control the opening and closing of a corresponding through hole 112.

The plurality of electrode assemblies 13 can also be fixed to the vacuum chamber 11 and disposed in the vacuum space 111. Each electrode assembly 13 may be arranged corresponding to a through hole 112. That is, each electrode assembly 13 can be used to control the opening and closing of the corresponding through hole 112.

The opening and closing of the through hole 112 can be controlled by energizing and deenergizing the electrode assembly 13. When the electrode assembly 13 is deenergized, a corresponding movable mass block 12 may be suspended over the through hole 112. Since the movable mass block 12 is suspended and the through hole 112 is not blocked, the through hole 112 can be communicated with the vacuum space 111, whereby the through hole 112 is open and can be used to suck a corresponding micro-element.

When the electrode assembly 13 is energized, the electrode assembly 13 can attract or repel the corresponding movable mass block 12 to move, and the through hole 112 may be blocked by the movable mass block 12. A material of the electrode assembly 13 may be a conductive material in a sheet shape. Correspondingly, a material of the movable mass block 12 may also be a conductive material in a sheet shape. When the electrode assembly 13 is energized, the electrode assembly 13 can generate static electricity, thereby can electrostatically attract the movable mass block 12. The electrode assembly 13 may also be a conductive coil. Correspondingly, the movable mass block 12 may be a sheet-shaped magnet. After being energized, the electrode assembly 13 can form a magnetic field which can exert a magnetic attraction or repulsive force on the movable mass block 12. The transfer device 100 in the present disclosure can also be connected to or internally provided with a control circuit. The control circuit may be used for the energization control of the plurality of electrode assemblies 13.

In the process of transferring micro-elements, each movable mass block 12 can be controlled to open or block the corresponding through hole 112 by the control of energizing or deenergizing the corresponding electrode assembly, whereby the micro-elements can be selectively sucked and transferred.

Specifically, in the embodiment shown in FIG. 1, the vacuum chamber 11 may have a square box structure and include an upper wall 113 and a lower wall 114 disposed opposite to each other. The plurality of through holes 112 can be defined in the lower wall 114. When the transfer device 100 is used to transfer micro-LEDs, the plurality of through holes 112 can be arranged in an array corresponding to an arrangement of micro-LEDs.

Each electrode assembly 13 may include a first electrode 131. In FIG. 1, the first electrode 131 can be disposed on the inner face of the lower wall 114. The corresponding through hole 112 may be defined penetrating through the first electrode 131. When the first electrode 131 is controlled to be energized, the movable mass block 12 can be attracted on the first electrode 131, that is, the movable mass block 12 can be moved from a first position where the movable mass block 12 is suspended over the through hole 112 to a second position where the through hole 112 is blocked by the movable mass block 12. When the first electrode 131 is grounded to discharge, the attractive force applied to the movable mass block 12 by the first electrode 131 can be eliminated. In this way, the movable mass block 12 can be restored to be suspended over the through hole 112, thus the through hole 112 can be open. In this embodiment, the opening and closing operation of the through hole 112 can be controlled by utilizing a first electrode 131, the electrostatic attraction of the first electrode 131, and the suspended state of the movable mass block 12, thereby achieving a selective suction and transfer for micro-elements.

Figure 2:
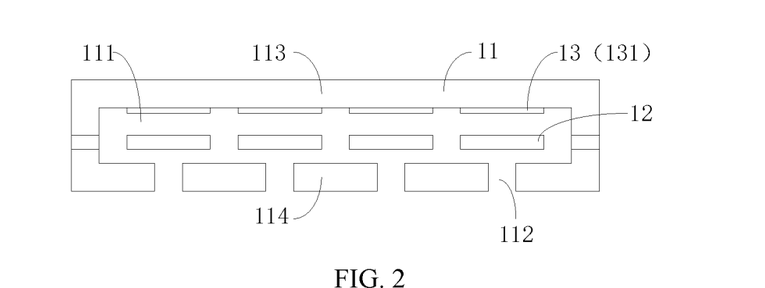
FIG. 2 is a structural view of a transfer device of micro-elements according to another embodiment of the present disclosure.

In addition to the attractive force of the first electrode 131, the repulsive force of the first electrode 131 can also be utilized. FIG. 2 is a structural view of a transfer device of micro-elements according to another embodiment of the present disclosure. The first electrode 131 may be disposed on the inner face of the upper wall 113 corresponding to the through hole 112. When the first electrode 131 is controlled to be energized, the movable mass block 12 can move to the through hole 112 under the repulsive force of the first electrode 131 and block the through hole 112. When the first electrode 131 is controlled to discharge, no repulsive force is applied to the movable mass block 12 by the first electrode 131, the movable mass block 12 can be restored to be suspended over the through hole 112, whereby the through hole 112 can be open.

Figure 3:
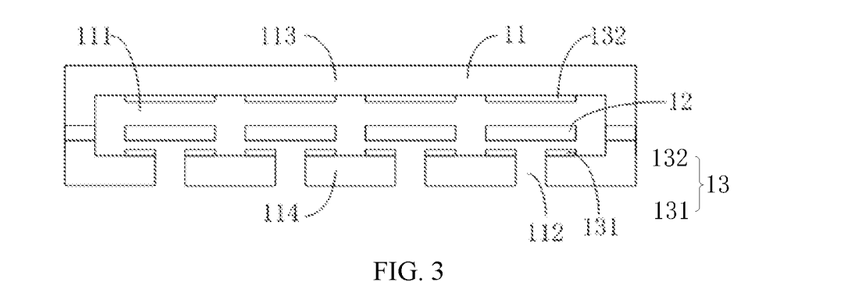
FIG. 3 is a structural view of a transfer device of micro-elements according to another embodiment of the present disclosure.

When the electrode assembly 13 is deenergized, the corresponding movable mass block 121 may be naturally suspended over the through hole 112. In the embodiments shown in FIG. 1 and FIG. 2, the state of natural suspension of the movable mass block 121 corresponds to the opening of the through hole 112 in the process of the suction and transfer for micro-elements. However, in this case, when the micro-components are sucked by vacuum, airflow may generate at the through hole 112, which may cause the movement of the movable mass block 121, resulting in that the through hole 112 cannot be opened stably. In this regard, another embodiment as shown in FIG. 3 is provided in the present disclosure. FIG. 3 is a structural view of a transfer device of micro-elements according to another embodiment of the present disclosure.

In the embodiment shown in FIG. 3, the electrode assembly 13 may further include a second electrode 132 disposed opposite to the first electrode 131. When it is controlled by the attraction of the electrode, the first electrode 131 can be disposed on an inner face of the lower wall 114, and the second electrode 132 can be disposed on the inner face of the upper wall 113. When it is controlled by the repulsive force of the electrode, the first electrode 131 may be disposed on the inner face of the upper wall 113 and the second electrode 132 may be disposed on the inner face of the lower wall 114.

Figure 4:
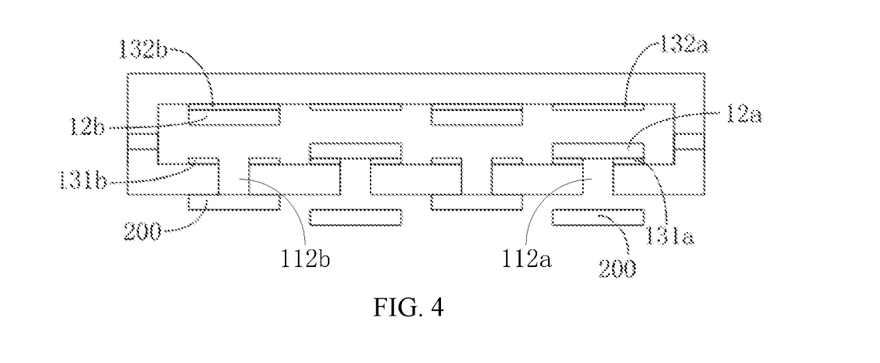
FIG. 4 is a structural view of the transfer device of micro-elements of FIG. 3 selectively sucking micro-elements.

In the embodiment shown in FIG. 3, the control of opening and blocking of the plurality of through holes 112 is achieved by utilizing the attraction of the electrodes. Specifically, the control manner of the plurality of through holes 112 can be described in conjunction with FIG. 4. FIG. 4 is a structural view of the transfer device of micro-elements of FIG. 3 selectively sucking micro-elements.

In FIG. 4, the first electrode 131a may be located on the inner face of the lower wall 114, and the second electrode 132a may be located on the inner face of the upper wall 113. When the first electrode 131a is controlled to be energized and the second electrode 132a is controlled to be deenergized, the movable mass block 12a can be attracted to the first electrode 131a, whereby the through hole 112a can be blocked and cannot be used to suck the micro-element 200. When the second electrode 132b is controlled to be energized and the first electrode 131b is controlled to be deenergized, the movable mass block 12b can be attracted to the second electrode 132b, thus the through hole 112b may be opened and can be used to suck the micro-element 200. The method to achieve the control through a repulsive effect of electrode is similar to that shown in FIG. 3 and will not be described in detail.

In the embodiments in which the movement of the movable mass block 12 can be controlled by the attraction of the electrode assembly 13 described above, both the material of the movable mass block 12 and the electrode assembly 13 can comprise silicon material or metal material. The metal material may specifically be silver, platinum, zinc, tungsten, molybdenum or other material. Generally, an element made of silicon material is thicker than an element made of metal material. Accordingly, the electrode penetrated by the through hole 112b can be preferably made of metal material. For example, in the embodiment shown in FIG. 3, the material of the first electrode 131 may be a metal material, the material of the second electrode 132 may be a silicon material, and the material of the movable mass block 12 may also be a silicon material. Specifically, the material of the movable mass block 12 and the second electrode 132 may be preferably a low-resistance silicon material. In this case, the movable mass block 12 can be attracted by the second electrode 132 by applying a relatively low power to the second electrode 132.

An insulating layer can be arranged on both surfaces of the first electrode 131 and the second electrode 132. The insulating layer can be used to prevent a loss of charge of the first electrode 131 and the second electrode 132. Specifically, a material of the insulating layer may be insulating material such as aluminum oxide material and magnesium oxide material.

Figure 5:
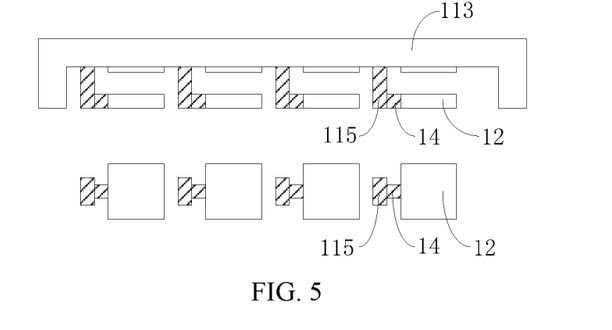
FIG. 5 is a structural view of the plurality of movable mass blocks of the transfer device of micro-elements of FIG. 3 arranged in a manner.

In the above-mentioned embodiment, the plurality of movable mass blocks 12 can be connected to each other to form a mesh structure to be suspended, or the plurality of movable mass blocks 12 can also be connected to the cantilever beam 14 to achieve the suspended arrangement. FIGS. 5-8 are structural views of four types of arrangement of the plurality of movable mass blocks in the embodiment of the transfer device shown in FIG. 3. In FIG. 5, at least one fixed seat 115 can be disposed in the vacuum space 111. The plurality of movable mass blocks 12 may be connected to the at least one fixed seat 115 through at least one cantilever beam 14 so as to be suspended over the plurality of through holes 112. The at least one fixed seat 115 may be fixed to the upper wall 113 or the lower wall 114. Each fixed seat 115 may be specifically located at a vacant position between two adjacent electrode assemblies 13. Each movable mass block 12 connected to the fixed seat 115 and located at a free end of the cantilever beam 14 may be arranged in corresponding to the electrode assembly 13. Taking the electrode assembly 13 attracting the movable mass block 12 as an example, when the electrode assembly 13 is energized, an attractive force generates and acts on the movable mass block 12, whereby the movable mass block 12 can be attracted. Since the cantilever beam 14 has an elasticity property, the movable mass block 12 can be completely attracted on the electrode assembly 13, whereby the through hole 112 may be blocked. When the electrode assembly 13 is deenergized or is grounded, the charge of the electrode assembly 13 will be lost, whereby the electrode assembly 13 has no force applied on the movable mass block 12, and the movable mass block 12 can be restored to be suspended over the through hole 112 under the elastic force of the cantilever beam 14, resulting in the through hole 112 open.

Figure 6:
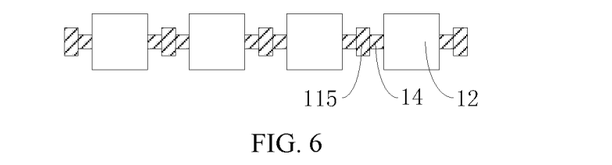
FIG. 6 is a structural view of the plurality of movable mass blocks of the transfer device of micro-elements of FIG. 3 arranged in another manner.

As shown in FIG. 6, the structure therein is similar to that in FIG. 5, a movable mass block 12 can be connected between two fixed seats 115 through two cantilever beams 14. Similarly, when energized, the electrode assembly 13 can apply a force to the movable mass block 12 such that the movable mass block 12 can be attracted on the electrode assembly 13, whereby the through hole 112 can be blocked.

When the electrode assembly 13 is deenergized or is grounded, the charge of the electrode assembly 13 will be lost, accordingly, the electrode assembly 13 has no force on the movable mass block 12, and the movable mass block 12 can be restored to be suspended over the through hole 112 under the elastic force of the cantilever beam 14, whereby, the through hole 112 can be in an open state. The structure in FIG. 6 has a high stability, thus the suction stability and transfer efficiency of the transfer device can be improved.

Figure 7:
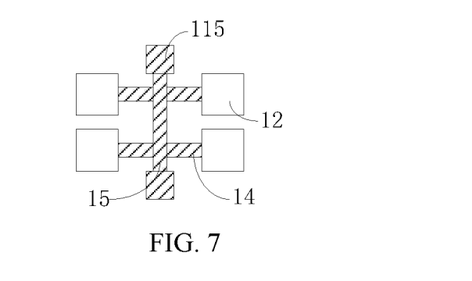
FIG. 7 is a structural view of the plurality of movable mass blocks of the transfer device of micro-elements of FIG. 3 arranged in another manner.

In FIG. 7, the at least one fixed seat 115 can be provided and used in common. A connecting beam 15 may be arranged between two fixed seats 115. The movable mass block 12 can be connected to the connecting beam 15 through the cantilever beam 14. In this way, no undue fixed seats 115 are needed, whereby the process can be simplified.

Figure 8:
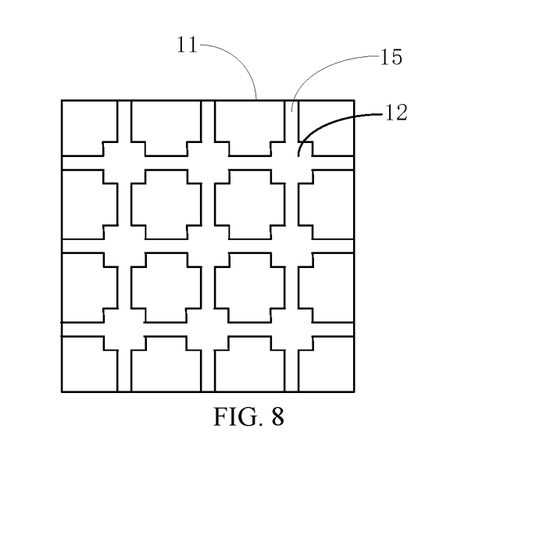
FIG. 8 is a structural view of the plurality of movable mass blocks of the transfer device of micro-elements of FIG. 3 arranged in another manner.

In FIG. 8, the plurality of movable mass blocks 12 may be connected with the at least one connecting beams 15 cooperatively to form a mesh structure. The mesh structure can be integrally connected to the vacuum chamber 11 and disposed in the vacuum space 111. Each movable mass block 12 may be suspended over a corresponding through hole 112. Similar to FIG. 5, the opening and closing of the through hole 112 can be controlled by a corresponding electrode assembly 13.

Figure 9:
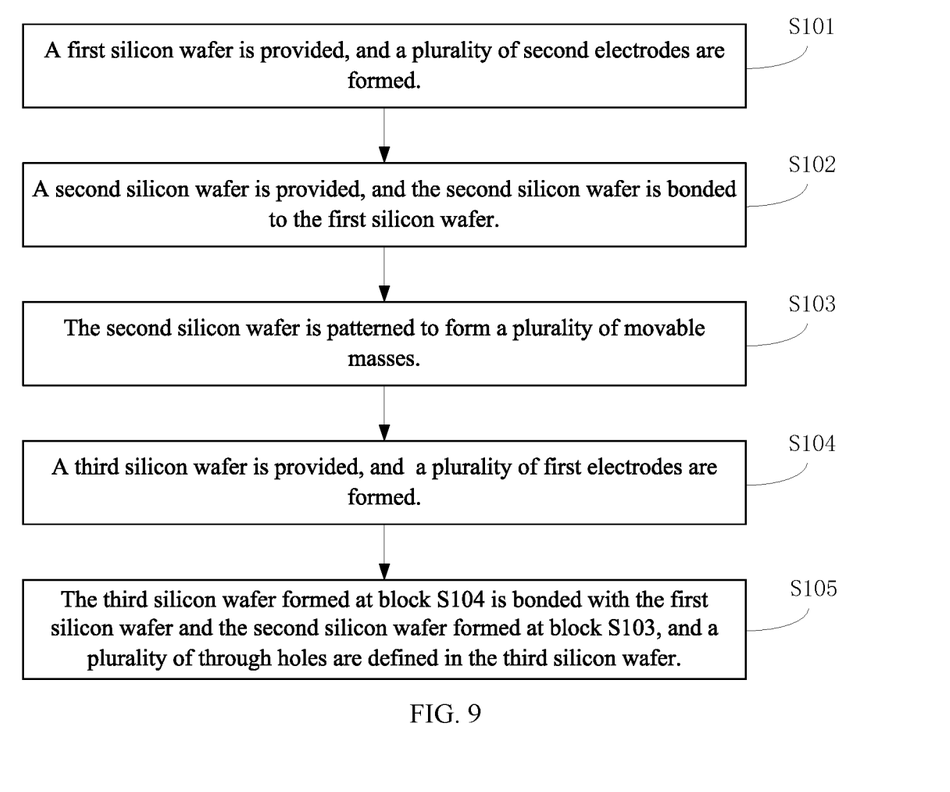
FIG. 9 is a flowchart illustrating a manufacturing method of the transfer device of micro-elements in FIG. 3.
Figure 10:
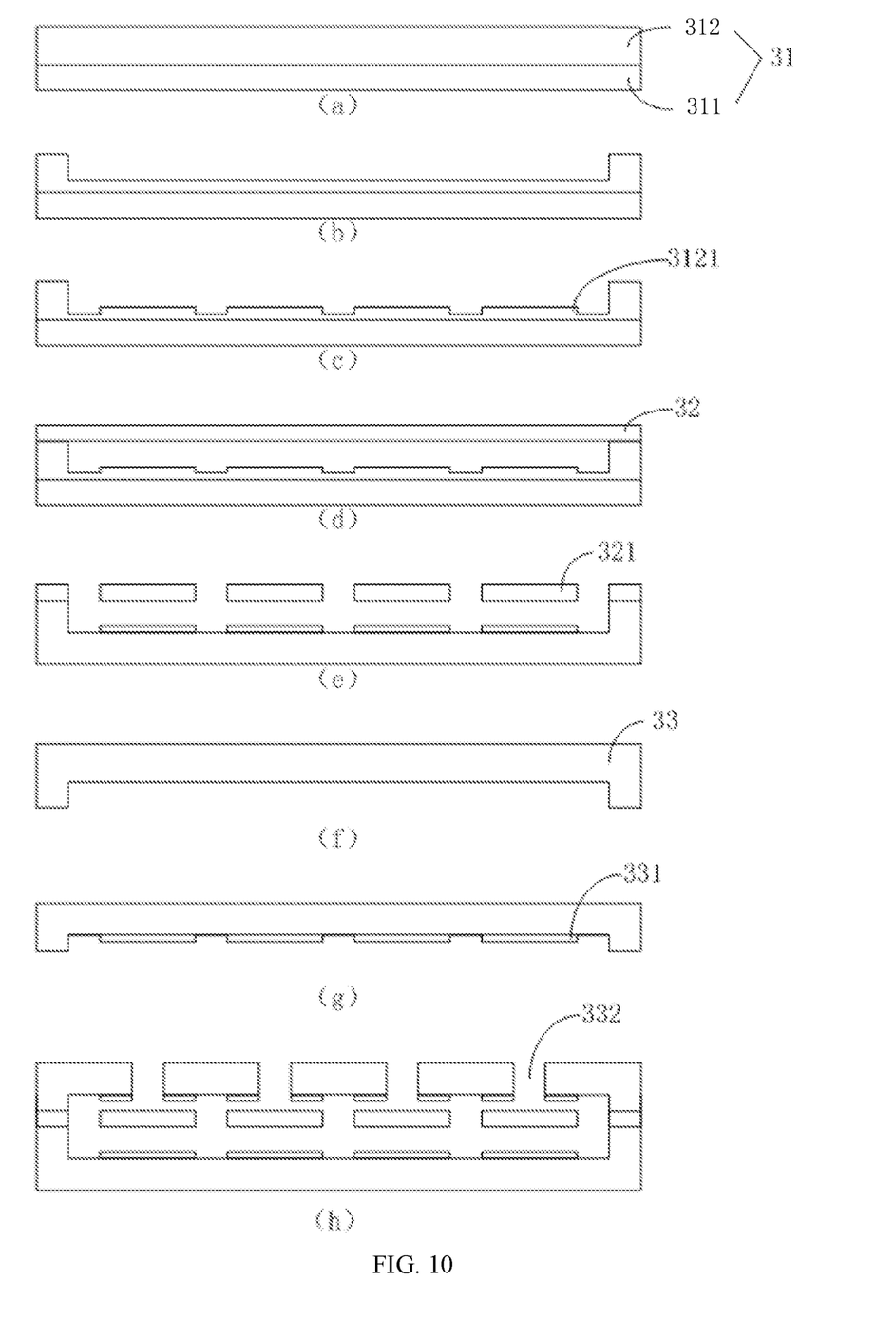
FIG. 10 is a schematic view illustrating related structures of the blocks shown in FIG. 9.

For the transfer device of the present disclosure capable of selectively sucking and transferring micro-elements, taking the embodiment shown in FIG. 3 as an example, the manufacturing method of the transfer device will be described below. Please refer to FIGS. 9 and 10, FIG. 9 is a flowchart illustrating a manufacturing method of the transfer device of micro-elements in FIG. 3. FIG. 10 is a schematic view illustrating related structures of the blocks shown in FIG. 9. The manufacturing method may include operations at blocks in FIG. 9.

At block S101: a first silicon wafer is provided, and a plurality of second electrodes are formed.

Specifically, the first silicon wafer 31 may be a SOI silicon wafer including a substrate layer 311 and a top silicon layer 312. As shown in FIG. 10a, a thickness of the top silicon layer 312 may be 1 μm~50 μm, and a resistivity thereof may be less than 1 Ω*cm. In this step S101, the top silicon layer 312 can be used to form the plurality of second electrodes 3121. Firstly, the top silicon layer 312 can be etched to define a shallow cavity, retaining at least one fixed seat (not shown) formed in the shallow cavity. A depth of the shallow cavity may be 1 μm~10 μm, as shown in FIG. 10b. Next, the top silicon layer 312 after being etched may be patterned to form a plurality of second electrodes 3121, as shown in FIG. 10c. A thickness of the at least one fixed seat may be equal to an original thickness of the top silicon layer 312. A thickness of the second electrode 3121 may be equal to a thickness of the top silicon layer 312 after being etched. Finally, an insulating layer may be formed on the second electrode 3121.

At block S102: a second silicon wafer is provided, and the second silicon wafer is bonded to the first silicon wafer.

In the step S102, the first silicon wafer and the second silicon wafer may be directly bonded with each other so that the two can be tightly coupled. Specifically, the two silicon wafers may be subjected to a surface polishing treatment and put into a solution with OH groups for soaking. Then polished surfaces of the two can be bonded together. The two bonded silicon wafers can be subjected to a high temperature treatment in oxygen or nitrogen for several hours to form a good bond.

At block S103: the second silicon wafer is patterned to form a plurality of movable mass blocks.

The second silicon wafer 32 may also be an SOI silicon wafer. After the second silicon wafer 32 is bonded with the first silicon wafer 31, the substrate layer in the SOI silicon wafer can be removed with the top silicon layer retained. Similarly, a thickness of the second silicon wafer 32 may be 1 μm~100 μm. A resistivity of the second silicon wafer 32 may be less than 1 Ω*cm.

Specifically, the second silicon wafer 32 can be bonded to the at least one fixed seat without being contacted with the plurality of second electrodes 3121, as shown in FIG. 10d. Hence, after the second silicon wafer 32 is patterned, at least one cantilever beam (not shown) connected to the at least one fixed seat and a plurality of movable mass blocks 321 can be formed. The plurality of movable mass blocks 321 may not be contacted with the plurality of second electrodes 3121, as shown in FIG. 10e.

At block S104: a third silicon wafer is provided, and a plurality of first electrodes are formed.

The third silicon wafer 33 may be an SOI silicon wafer. A thickness of a top silicon layer may be 5 μm~100 μm. Since the top silicon layer of the third silicon wafer may not be used for manufacturing first electrodes, there is no limit to its resistivity. In the subsequent steps, a plurality of through holes may be defined in the top silicon layer of the third silicon wafer, thus the thickness of the top silicon layer of the third silicon wafer 33 may be larger than that of the other two silicon wafers.

In this step S104, firstly, the top silicon layer can be etched to define a shallow cavity with a depth of 1 μm~10 μm, as shown in FIG. 10f. Next, a metal material can be sputtered in the shallow cavity to form the plurality of first electrodes 331 and metal wirings, as shown in FIG. 10g. Before the sputtering, an insulating layer may need to be formed in the shallow cavity to isolate the top silicon layer and the plurality of first electrodes 331 made of the metal material. Finally, an insulating layer may be formed on the plurality of first electrodes 331.

At block S105: the third silicon wafer formed at block S104 is bonded with the first silicon wafer and the second silicon wafer formed at block S103, and a plurality of through holes are defined in the third silicon wafer.

After the above bonding, since a shallow cavity is defined through etching the third silicon wafer 33, the plurality of first electrodes 331 may not be contacted with the plurality of movable mass blocks 321. In this step S105, a deep silicon etching can be performed on the third silicon wafer 33 to define the plurality of through holes 332, as shown in FIG. 10h. When the third silicon wafer 33 is an SOI silicon wafer, a substrate layer may need to be removed after bonding. In the finally obtained transfer device 300, each movable mass block 321 may be suspended over a corresponding through hole 332.

In the transfer device manufactured by the above manufacturing method, a control circuit may be connected to the plurality of second electrodes 3121 and the plurality of first electrodes 331 to control the plurality of second electrodes 3121 and the plurality of first electrodes 331 to be selectively energized, so that the movement of the plurality of movable mass blocks 321 can be controlled. In this way, the control of opening and closing of the plurality of through holes 332 can be realized, and the selective suction and transfer of the micro-elements can further be realized.

The above description is only some embodiments of the present disclosure, and it is not intended to limit the protection scope of the present disclosure. Any equivalent structure or equivalent process transformation made according to the contents of the specification and drawings of this disclosure, or a direct or indirect application of the above scheme in other related technical fields, are all considered to be included in the scope of patent protection of this disclosure.

What is claimed is:

1. A transfer device of micro-elements, comprising:
   a vacuum chamber, defining a vacuum space and a plurality of through holes communicating the vacuum space with outside, wherein the plurality of through holes is configured to suck the micro-elements and the vacuum chamber comprises an upper wall and a lower wall disposed opposite to each other;
   a plurality of movable mass blocks, arranged in the vacuum chamber, wherein each movable mass block is arranged corresponding to a respective through hole of the plurality of through holes;
   a plurality of electrode assemblies, disposed in the vacuum space and fixed to the vacuum chamber, wherein each electrode assembly is arranged corresponding to a respective through hole of the plurality of through holes and each electrode assembly comprises a first electrode disposed on an inner face of the lower wall of the vacuum chamber;
   wherein,
   when the plurality of electrode assemblies is not energized, a corresponding movable mass block is suspended over a corresponding through hole and the corresponding through hole is opened, and
   when the plurality of electrode assemblies is energized, the plurality of electrode assemblies attracts or repels the corresponding movable mass block to move and the corresponding through hole is blocked by the corresponding movable mass block.

2. The transfer device according to claim 1, wherein the plurality of through holes are defined in the lower wall.

3. The transfer device according to claim 2, wherein a corresponding through hole is defined penetrating through the first electrode, and when the first electrode is energized, a corresponding movable mass block is attracted by the first electrode to block the corresponding through hole.

4. The transfer device according to claim 3, wherein each electrode assembly further comprises:
   a second electrode disposed opposite to the first electrode and on an inner face of the upper wall, and when the second electrode is energized, the corresponding movable mass block is attracted by the second electrode to open the corresponding through hole.

5. The transfer device according to claim 4, wherein a material of the first electrode comprises a metal material, a material of the second electrode comprises a silicon material, and a material of the movable mass block comprises a silicon material.

6. The transfer device according to claim 4, wherein a first insulating layer is arranged on a surface of the first electrode and a second insulating layer is arranged on a surface of the second electrode.

7. The transfer device according to claim 2, wherein each electrode assembly comprises a first electrode disposed on an inner face of the upper wall corresponding to a through hole, and when the first electrode is energized, a corresponding through hole is blocked by a corresponding movable mass block under a repulsive force of the first electrode.

8. The transfer device according to claim 7, wherein each electrode assembly further comprises:
   a second electrode disposed opposite to the first electrode and on an inner face of the lower wall, a corresponding through hole is defined penetrating through the second electrode, and when the second electrode is energized, the corresponding movable mass block is repelled by the second electrode to open the corresponding through hole.

9. The transfer device according to claim 8, wherein a first insulating layer is arranged on a surface of the first electrode and a second insulating layer is arranged on a surface of the second electrode.

10. The transfer device according to claim 1, wherein at least one fixed seat is disposed in the vacuum space and the plurality of movable mass blocks is connected with the at least one fixed seat via at least one cantilever beam to suspend over the plurality of through holes.

11. The transfer device according to claim 10, wherein each movable mass block is connected to a corresponding fixed seat via a corresponding cantilever beam, or each movable mass block is connected between two corresponding fixed seats via two corresponding cantilever beams.

12. The transfer device according to claim 10, wherein the number of the at least one fixed seat is at least two, at least one connecting beam is arranged between at least two fixed seats, and the plurality of movable mass blocks is connected with the at least one connecting beam via at least one cantilever beam to suspend over the plurality of through holes.

13. The transfer device according to claim 12, wherein the plurality of movable mass blocks is connected with the at least one connecting beam cooperatively to form a mesh structure, the mesh structure is connected to the vacuum chamber and arranged in the vacuum space, and each movable mass block is suspended over a corresponding through hole.

14. The transfer device according to claim 1, wherein the plurality of through holes is disposed in an array.

* * * * *